(12) United States Patent
Kiyohara

(10) Patent No.: US 7,847,640 B2
(45) Date of Patent: Dec. 7, 2010

(54) VOLTAGE CONTROLLED OSCILLATOR

(75) Inventor: Atsushi Kiyohara, Chigasaki (JP)

(73) Assignee: Epson Toyocom Corporation (JP)

( * ) Notice: Subject to any disclaimer, the term of this patent is extended or adjusted under 35 U.S.C. 154(b) by 296 days.

(21) Appl. No.: 11/992,626

(22) PCT Filed: Sep. 25, 2006

(86) PCT No.: PCT/JP2006/319631

§ 371 (c)(1),
(2), (4) Date: Mar. 26, 2008

(87) PCT Pub. No.: WO2007/037456

PCT Pub. Date: Apr. 5, 2007

(65) Prior Publication Data

US 2009/0134943 A1    May 28, 2009

(30) Foreign Application Priority Data

Sep. 27, 2005  (JP) .............................. 2005-280715

(51) Int. Cl.
*H03L 7/00* (2006.01)
(52) U.S. Cl. .................... 331/16; 331/185; 331/175; 331/34; 331/183
(58) Field of Classification Search .................... 331/34, 331/185, 183, 175
See application file for complete search history.

(56) References Cited

U.S. PATENT DOCUMENTS 5,319,345 A    6/1994    Abe et al.

7,230,505 B2 *  6/2007  Rachedine et al. .......... 331/179

FOREIGN PATENT DOCUMENTS

| JP | 49-131615 | 12/1974 |
|---|---|---|
| JP | 49-131615 A | 12/1974 |
| JP | 01-225210 A | 9/1989 |
| JP | 05-110370 A | 4/1993 |
| JP | 05-129957 | 5/1993 |
| JP | 05-129957 A | 5/1993 |
| JP | 2002-076773 A | 3/2002 |
| JP | 2005-303388 A | 10/2005 |
| JP | 2006-033092 A | 2/2006 |
| JP | 2006-086679 A | 3/2006 |

OTHER PUBLICATIONS

International Search Report for PCT/JP2006/319631, mailed Jan. 9, 2007; ISA/JPO (in English).

* cited by examiner

*Primary Examiner*—Arnold Kinkead
(74) *Attorney, Agent, or Firm*—Harness, Dickey & Pierce, P.L.C.

(57) ABSTRACT

A voltage controlled oscillator controls an oscillation frequency based on a control voltage supplied from an external control voltage terminal. The voltage controlled oscillator includes a reference bias voltage circuit and a gain adjustment circuit. The reference bias voltage circuit includes multiple serial resistances between a reference voltage and a ground. The reference bias voltage circuit controls a switch coupled in parallel to at least one of the serial resistances and thus changes a voltage dividing ratio of the serial resistances so as to set a reference bias voltage. The gain adjustment circuit adjusts a gain of the control voltage. The gain adjustment circuit includes multiple resistances and multiple switching elements. The gain adjustment circuit controls the switching elements to form a voltage dividing circuit between the reference bias voltage and the external control voltage terminal so as to generate an automatic frequency control voltage.

3 Claims, 8 Drawing Sheets

(STATE OF BIT)

| STATE | GAFC 2 | GAFC 1 |
|---|---|---|
| 1 | Hi | Hi |
| 2 | Hi | Low |
| 3 | Low | Hi |
| 4 | Low | Low |

FIG. 9a
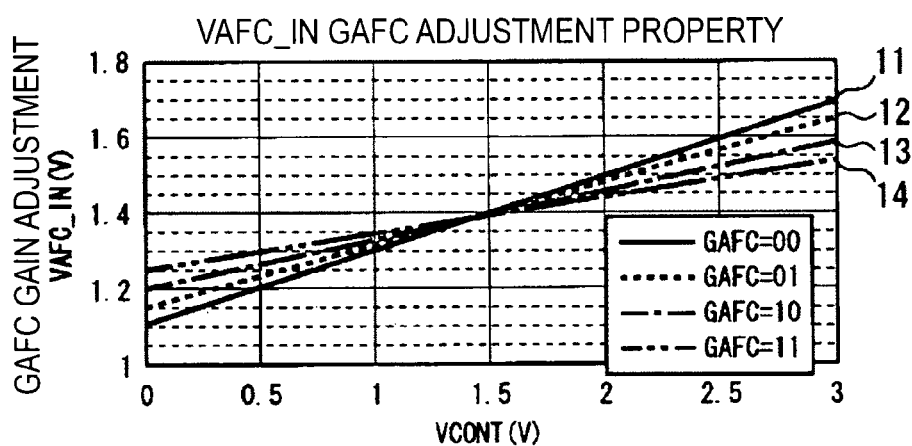
FIG. 9b
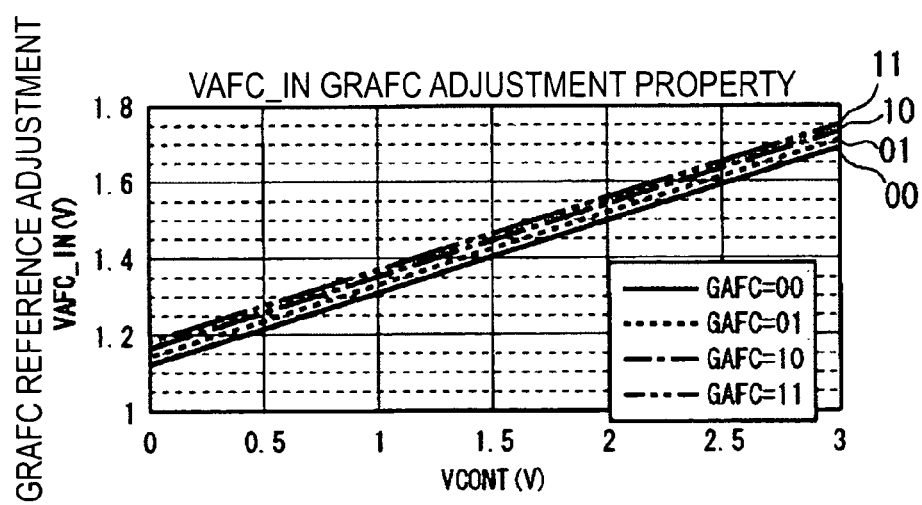
FIG. 9c

VOLTAGE CONTROLLED OSCILLATOR

CROSS-REFERENCE TO RELATED APPLICATIONS

This application is a U.S. National Stage Application of International application No. PCT/JP2006/319631, filed Sep. 25, 2006 and published in Japanese as WO 2007/037456 A1 on Apr. 5, 2007. This application claims the benefit of Japanese Application No. 2005-280715, filed Sep. 27, 2005. The disclosure(s) of the above applications are incorporated herein by reference.

FIELD OF THE INVENTION

The present invention relates to a voltage control oscillator, in particular, to a fine adjustment technique of an AFC voltage in which a noise is reduced and C/N is improved.

BACKGROUND TECHNOLOGY

An IC-compatible oscillator is provided with an operational amplifier having an AFC function (Automatic Frequency Control function). Namely, a resistance value of the operational amplifier is controlled so as to arbitrarily change a gain and a reference value of an external voltage. Thus variation of electrical properties among respective ICs has been adjusted so as to obtain an AFC property corresponding to a plurality of specifications demanded by customers with one type of IC. FIG. 11 is a diagram showing a circuit including an operational amplifier having related art AFC function. In this AFC circuit, a control voltage from a VCONT terminal is inputted to an operational amplifier 30 constituting an AFC gain adjustment circuit 34. A gain adjustment of the operational amplifier 30 is conducted by adjusting a resistance R10 in accordance with memory data stored in a memory. A reference adjustment of the AFC circuit is conducted by an operational amplifier 31 constituting a reference adjustment circuit 35. A reference adjustment of the operational amplifier 31 is conducted by adjusting a resistance R1 in accordance with memory data stored in the memory. These voltages are amplified by an operational amplifier 32 to be VAFC, being applied to a varactor 33 of an oscillation circuit 36.

[Patent Document 1] Japanese Unexamined Patent Publication Application No. 2005-303388

[Patent Document 2] Japanese Unexamined Patent Publication Application No. 2006-033092

[Patent Document 3] Japanese Unexamined Patent Publication Application No. 2006-086679

DISCLOSURE OF THE INVENTION

However, the use of the related art operational amplifier shown in FIG. 11 causes such problem that an unwanted voltage noise is applied to the varactor 33 (variable capacitance diode) for AFC to deteriorate C/N. Further, the use of the operational amplifier requires a capacitor for phase compensation, so that an extra chip area is required in an IC, interfering a miniaturization.

The present invention is intended to provide a voltage control oscillator in which a resistance voltage dividing circuit is formed by a switching element so as to arbitrarily change a gain and a reference value of a control voltage, an IC chip area is reduced, and reduction of a noise of AFC voltage and improvement of C/N are realized.

In order to solve such problems, the invention defined in Claim 1 is characterized by that a voltage control oscillator controlling an oscillation frequency of an oscillator by a control voltage supplied from an external control voltage terminal includes: a reference bias voltage generating means generating a reference bias voltage by adjusting a reference voltage; and a gain adjustment circuit adjusting a gain of the control voltage, wherein the gain adjustment circuit is provided with a plurality of resistances and a plurality of switching elements, and the gain adjustment circuit controls the plurality of switching elements and thus forms a voltage dividing circuit between the reference bias voltage and the external control voltage terminal so as to generate an AFC voltage.

The present invention omits a driving circuit of Claim 1. That is, the switching elements are structured such that they are turned ON/OFF by hand.

The voltage control oscillator according to the invention defined in Claim 2 is characterized by that the gain adjustment circuit is provided with a plurality of resistances, a plurality of switching elements, and a driving circuit driving each of the switching elements, and the gain adjustment circuit controls the plurality of switching elements and thus forms a voltage dividing circuit between the reference bias voltage and the external control voltage terminal so as to generate an AFC voltage.

In the invention, the voltage dividing circuit dividing by resistances includes the plurality of resistances and the switching elements coupling the resistances in the gain adjustment circuit and it is formed depending on the connecting fashion of the switching elements. Each of the switching elements is turned ON/OFF by the driving circuit.

The voltage control oscillator according to the invention defined in Claim 3 is characterized by that the voltage dividing circuit couples a control voltage, that is supplied through a serial resistance coupled to the external control voltage terminal, with the reference bias voltage generating means directly or through at least one of the resistances based on a connecting state of the plurality of switching elements so as to change the AFC voltage.

In order to adjust the AFC voltage based on the reference bias voltage and the control voltage, the voltage dividing circuit is provided between the reference bias voltage generating means and the external control voltage terminal to change the voltage dividing ratio of the voltage dividing circuit. That is, the voltage dividing circuit couples the control voltage, that is supplied through a serial resistance coupled to the external control voltage terminal, to the reference bias voltage generating means directly or through at least one resistance based on the connecting state of the plurality of switching elements, being able to change the voltage dividing ratio.

The voltage control oscillator according to the invention defined in Claim 4 is characterized by that the reference bias voltage generating means is provided with a plurality of serial resistances provided between the reference voltage and a ground and a switch coupled to at least one of the serial resistances in parallel, and the reference bias voltage generating means cuts and connects the switch and thus changes a voltage dividing ratio of the serial resistances so as to set the reference bias voltage.

The simplest way of adjusting the reference bias voltage is to provide a switch on the plurality of serial resistances and turn ON/OFF the switch so as to change the resistance dividing ratio.

The invention defined in Claim 5 is characterized by that the reference voltage is applied to one terminal of a varactor of the voltage control oscillator and the AFC voltage is applied to the other terminal of the varactor.

The reference voltage and the AFC voltage are applied to the terminals of the varactor in the oscillator, so that even if noises in phase are applied to the varactor, the noises are cancelled each other due to their same phase.

According to the invention defined in Claim 1, the gain adjustment circuit is provided with the plurality of resistances and switching elements coupling respective resistances and is provided with the voltage dividing circuit formed by turning ON/OFF the switching elements by hand, being able to improve the C/N due to the reduced noise at a lower cost.

In the invention defined in Claim 2, the gain adjustment circuit includes a plurality of resistances and switching elements coupling respective resistances. In the gain adjustment circuit, a voltage dividing circuit is formed by the connecting fashion of the switching elements, requiring no capacitors. Thus an area of an IC chip can be reduced and the C/N can be improved due to the decrease of a noise.

In the invention defined in Claim 3, the voltage dividing circuit couples a control voltage to the reference bias voltage generating means directly or through at least one resistance based on a connecting state of the plurality of switching elements. The control voltage is supplied through serial resistance coupled to the external control voltage terminal. Thus, the AFC voltage can be easily changed by changing the number of resistances in the voltage dividing circuit.

In the invention defined in Claim 4, the reference bias voltage generating means changes a voltage dividing ratio of the plurality of resistances provided between the reference voltage and the ground by switches so as to change a reference bias voltage value, thus being able to easily change the reference bias voltage with a simple structure.

In the invention defined in Claim 5, since the reference voltage is applied to the one terminal of the varactor and the AFC voltage is applied to the other terminal of the varactor in the voltage control oscillator, noises in phase can be cancelled.

BRIEF DESCRIPTION OF THE DRAWINGS

FIG. 9A is a graph showing a state of a bit of SW_AG1 and SW_AG2 (SW_AR1 and SW_AR2). FIG. 9B and FIG. 9C are graphs showing a GAFC adjustment property and a GRAFC adjustment property when an operation example of a voltage control oscillator according to the second embodiment of the invention is changed from a state 11 to a state 14.

DESCRIPTION OF PREFERRED EMBODIMENTS

Embodiment of the present invention will now be described circumstantially with reference to the accompanying drawings. Note that elements, kinds, combinations, shapes, relative positions, and the like described in the embodiments do not limit the range of this invention, but are only examples unless the description gives a special statement.

Figure 1A:
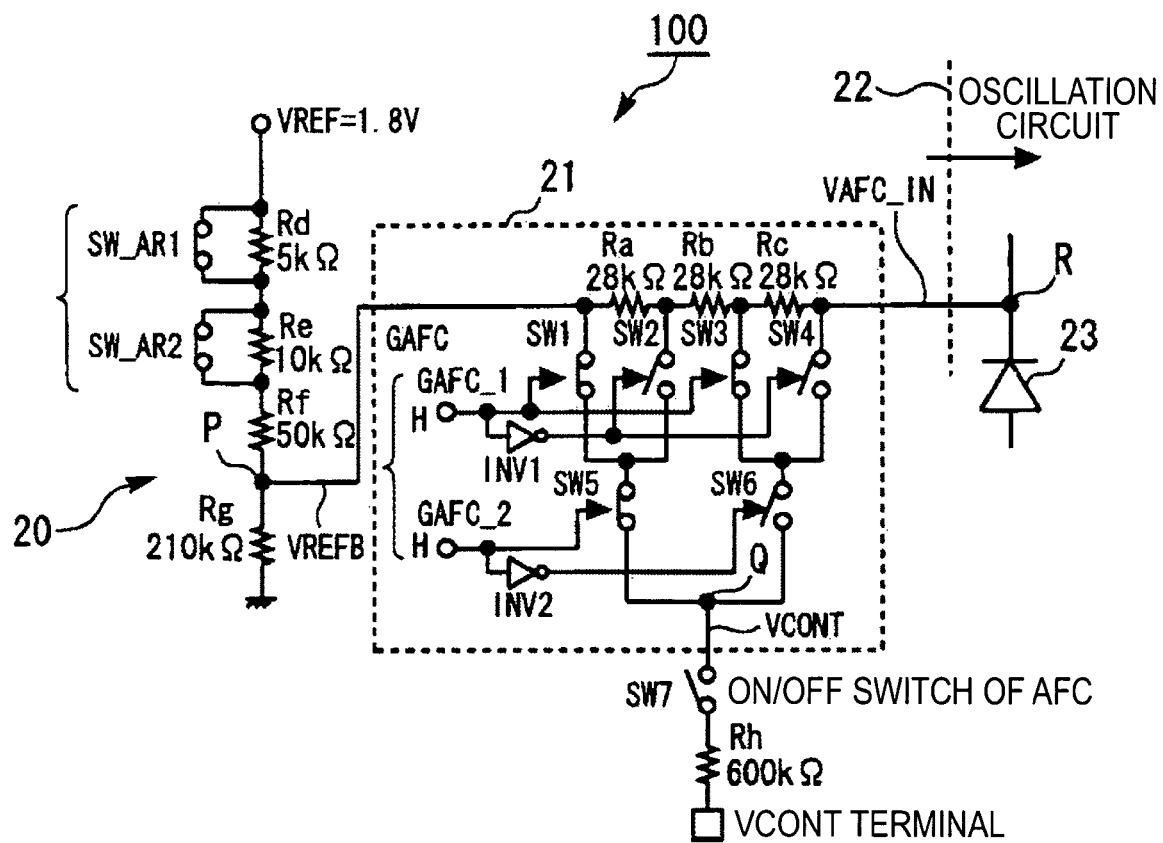
FIG. 1a is a circuit diagram showing an operation example (state 1) of a voltage control oscillator according to a first embodiment of the invention.
Figure 1B:
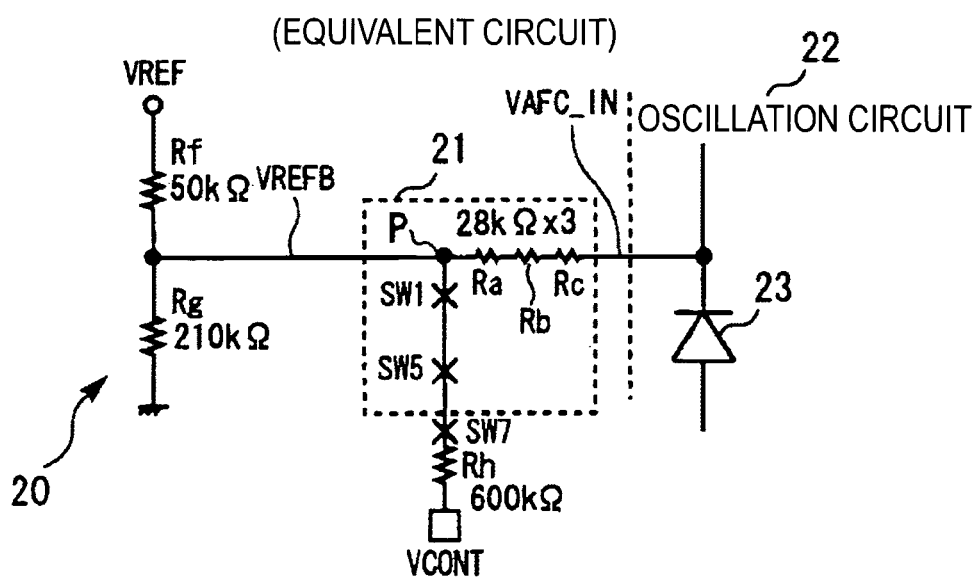
FIG. 1b is a diagram showing an equivalent circuit thereof.

FIG. 1a is a circuit diagram showing an operation example (state 1) of a voltage control oscillator according to a first embodiment of the invention, and FIG. 1b is a diagram showing an equivalent circuit thereof. This voltage control oscillator 100 includes: a reference bias voltage generating means 20 that generates a reference bias voltage (hereinafter, referred to as VREFB) by adjusting a reference voltage (hereinafter, referred to as VREF); a gain adjustment circuit 21 that adjusts a gain of a control voltage (hereinafter, referred to as VCONT); and an oscillation circuit 22. The reference bias voltage generating means 20 includes resistances Rd, Re, Rf, Rg connecting between the VREF and a ground in series; and switches SW_AR1, SW_AR2 respectively coupling to the resistance Rd and the resistance Re in parallel. The gain adjustment circuit 21 includes three resistances Ra, Rb, Rc; switches SW1 to SW6; and inverters INV1, INV2. The oscillation circuit 22 includes a varactor 23 on the assumption of a Colpitts oscillation circuit. The VREFB is outputted from a connecting point P between the resistance Rf and the resistance Rg in the reference bias voltage generating means 20 to be supplied to the gain adjustment circuit 21. The VCONT terminal is coupled to a connecting point Q in the gain adjustment circuit 21 from the VCONT terminal through Rh and SW7. An output voltage (hereinafter, referred to as VAFC-IN) from the gain adjustment circuit 21 is coupled to a cathode terminal R of the varactor 23 in the oscillation circuit 22.

The structure of the gain adjustment circuit 21 will now be described in detail. The present embodiment describes two bits that are GAFC1 and GAFC2. One bit GAFC1 directly controls SW1 and SW3, and a bit obtained by inverting the bit of GAFC1 by the INV1 controls SW2 and SW4. The other bit GAFC2 directly controls SW5, and a bit obtained by inverting the bit of GAFC2 by the INV2 controls SW6. That is, a switch coupled to each of the bits GAFC1 and GAFC2 is controlled such that when the bit is "Hi", the switch is turned "ON" (the switch is closed), and when the bit is "Low", the switch is turned "OFF" (the switch is opened).

Figures 2, 3:
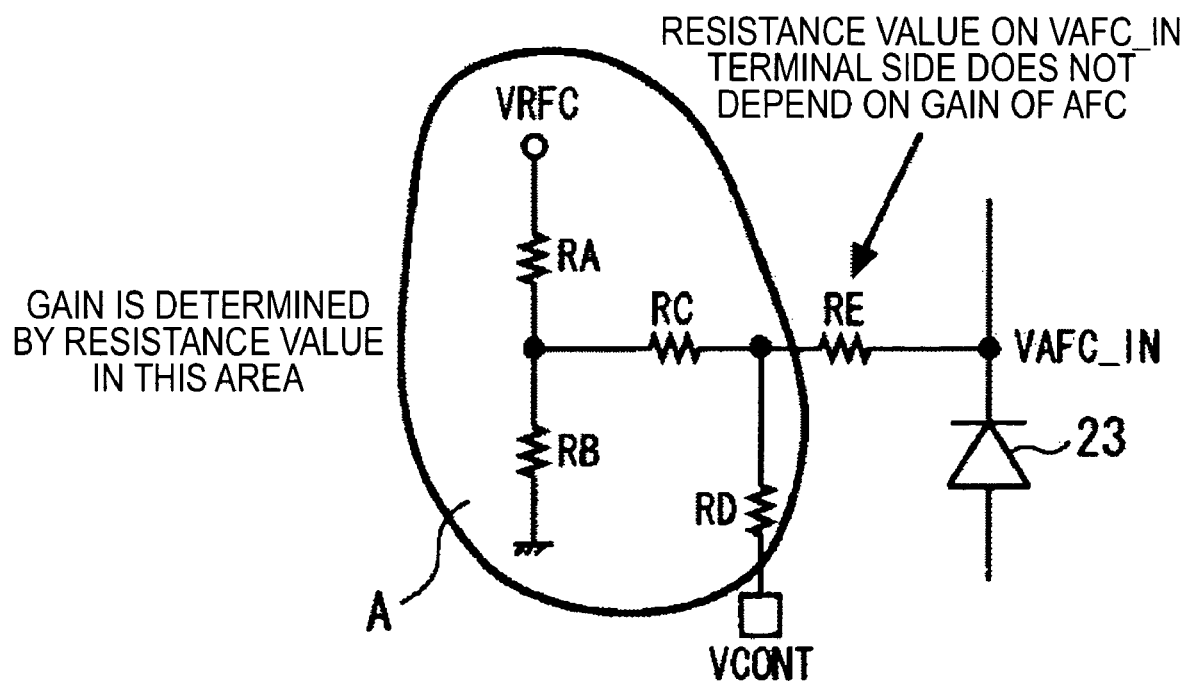
FIG. 2 is a table showing a state of a bit of GAFC1 and GAFC2.
FIG. 3 is a diagram explaining a resistance contributing to a gain of a gain adjustment circuit.

FIG. 2 is a table showing a state of the bits of GAFC1 and GAFC2. Both of the GAFC1 and the GAFC2 are "Hi" in a state 1. The GAFC1 is "Low" and the GAFC2 is "Hi" in a state 2. The GAFC1 is "Hi" and the GAFC2 is "Low" in a state 3. Both of the GAFC1 and the GAFC2 are "Low" in a state 4.

An operation in the state 1 will now be described with reference to FIG. 1a. Since both of the GAFC1 and the GAFC2 of the gain adjustment circuit 21 are "Hi" in the state1, the SW1 and the SW3 coupled to the GAFC1 turn "ON", and the SW2 and the SW4 turn "OFF". The SW5 coupled to the GAFC2 turns "ON", and the SW6 turns "OFF". As a result, if the SW7 is turned "ON", the VCONT is coupled to the VREFB through the SW5 and the SW1. Then the voltage VAFC_IN is applied to the varactor 23 through the resistances Ra, Rb, and Rc. At this time, both of the switches SW_AR1 and SW_AR2 are turned "ON".

FIG. 1b shows an equivalent circuit of the voltage control oscillator 100 in the state 1. Namely, both of the switches SW_AR1 and SW_AR2 of the reference bias voltage generating means 20 are "ON", so that VREF is divided by the resistances Rf and Rg to be VREFB, being supplied to the gain adjustment circuit 21. In the gain adjustment circuit 21, the SW1 and the SW5 are "ON". Therefore, if the SW7 is turned "ON", the VCONT terminal is coupled to the P through a route Rh-SW7-SW1-SW5. As a result, a composite voltage composed of a voltage on the connecting point P and a voltage based on the VCONT applied through the resistance Rh, the SW7, the SW1, and the SW5 is applied through the three resistances Ra, Rb, and Rc to the varactor 23 as VAFC_IN. That is, a potential of the VAFC_IN is a value of a composite voltage composed of a voltage obtained by dividing the VCONT by a voltage dividing circuit including the resistance Rg and the resistance Rh, and a voltage obtained by dividing the VREF by a voltage dividing circuit including the resistances Rd, Re, Rf, and Rg. Here, a resistance contributing a gain of the gain adjustment circuit 21 will be described with reference to FIG. 3. In this figure, resistances RA and RB are voltage dividing resistances of the reference bias voltage generating means 20, resistances RC and RE are in the adjustment circuit 21, and a resistance RD is coupled to the VCONT terminal in series. The resistances in an area A contributes to a gain of the gain adjustment circuit 21. Namely, the resistances RA, RB, RC, and RD contribute to the gain, and the resistance RE does not contribute to the gain. Therefore, the three resistances Ra, Rb, and Rc in the equivalent circuit in FIG. 1b do not contribute to a gain. Hereinafter, the equivalent circuit will be understood in the same manner.

Figure 4A:
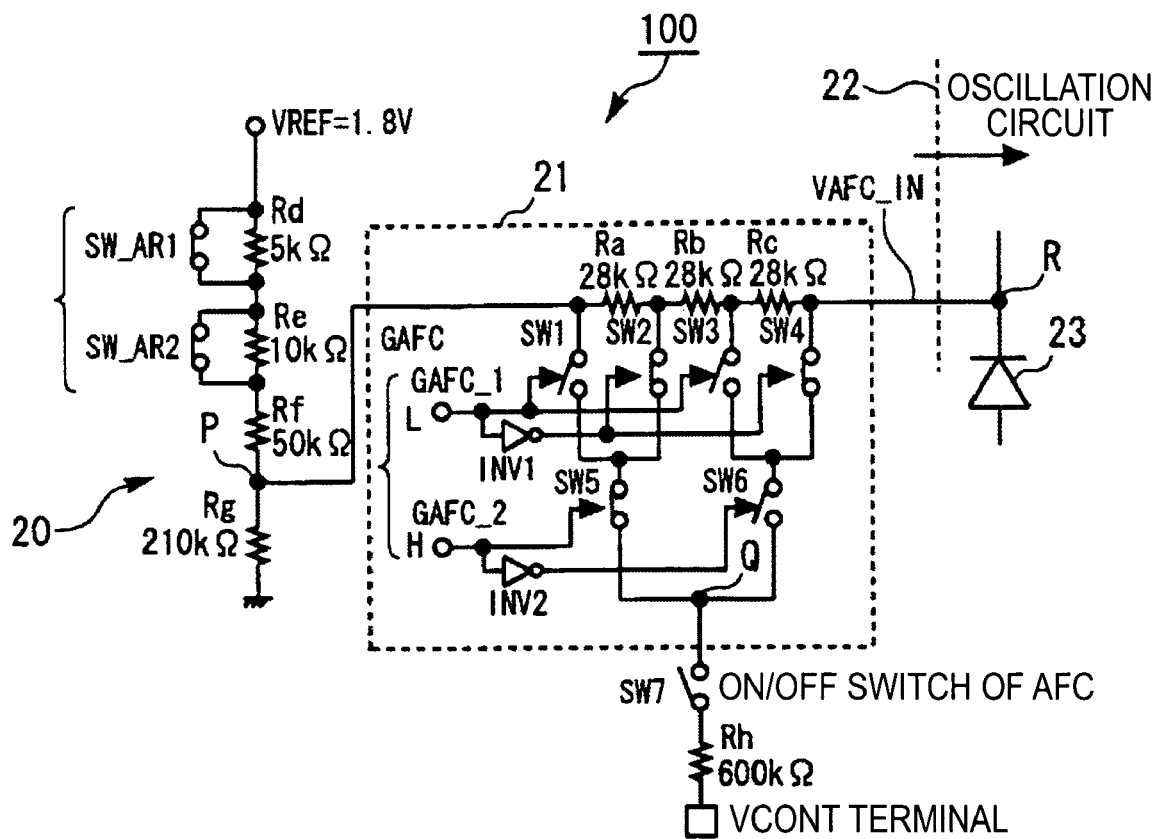
FIG. 4a is a circuit diagram showing an operation example (state 2) of a voltage control oscillator according to the first embodiment of the invention.
Figure 4B:
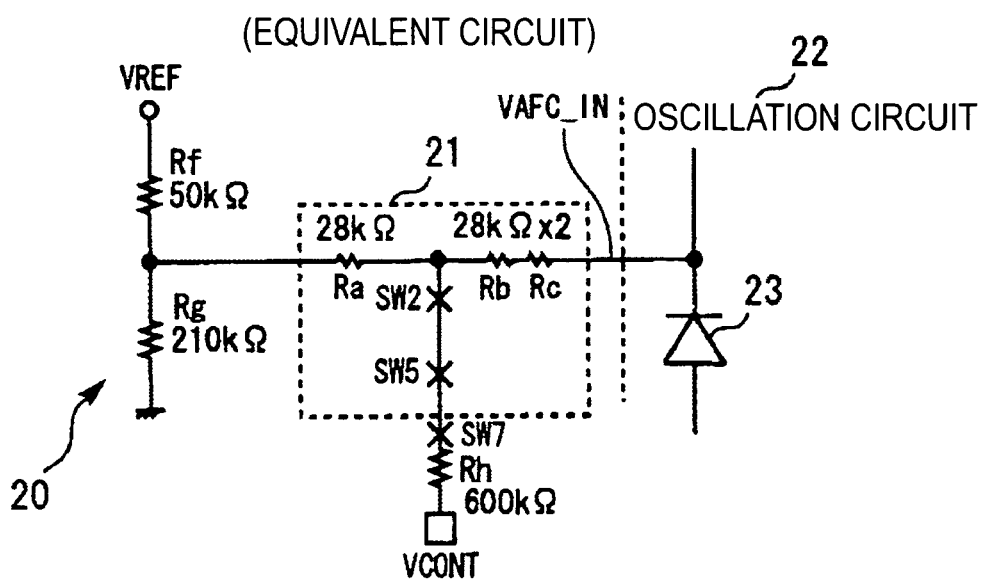
FIG. 4b is a diagram showing an equivalent circuit thereof.

FIG. 4a is a circuit diagram showing an operation example (state 2) of a voltage control oscillator according to the first embodiment of the invention, and FIG. 4b is a diagram showing an equivalent circuit thereof. Since this voltage control oscillator 100 has the same structure as that of FIG. 1, a description thereof is omitted.

FIG. 4b shows an equivalent circuit of the voltage control oscillator 100 in the state 2. Namely, both of the switches SW_AR1 and SW_AR2 of the reference bias voltage generating means 20 are "ON", so that VREF is divided by the resistances Rf and Rg to be VREFB, being supplied to the gain adjustment circuit 21. In the gain adjustment circuit 21, the SW2 and the SW5 are "ON". Therefore, if the SW7 is turned "ON", the VCONT terminal is coupled to the P through a route Rh-SW7-SW2-SW5. As a result, a composite voltage composed of a voltage on the connecting point and a voltage based on the VCONT applied through the resistance Rh, the SW7, the SW5, and the SW2 is applied through the two resistances Rb and Rc to the varactor 23 as VAFC_IN. That is, a potential of the VAFC_IN is a value of a composite voltage composed of a voltage obtained by dividing the VCONT by a voltage dividing circuit including the resistances Rg, Ra and Rh, and a voltage obtained by dividing the VREF by a voltage dividing circuit including the resistances Rf and Rg. Therefore, the two resistances Rb and Rc in the equivalent circuit in FIG. 4b do not contribute to a gain, but the resistance Ra contributes to the gain.

Figure 5A:
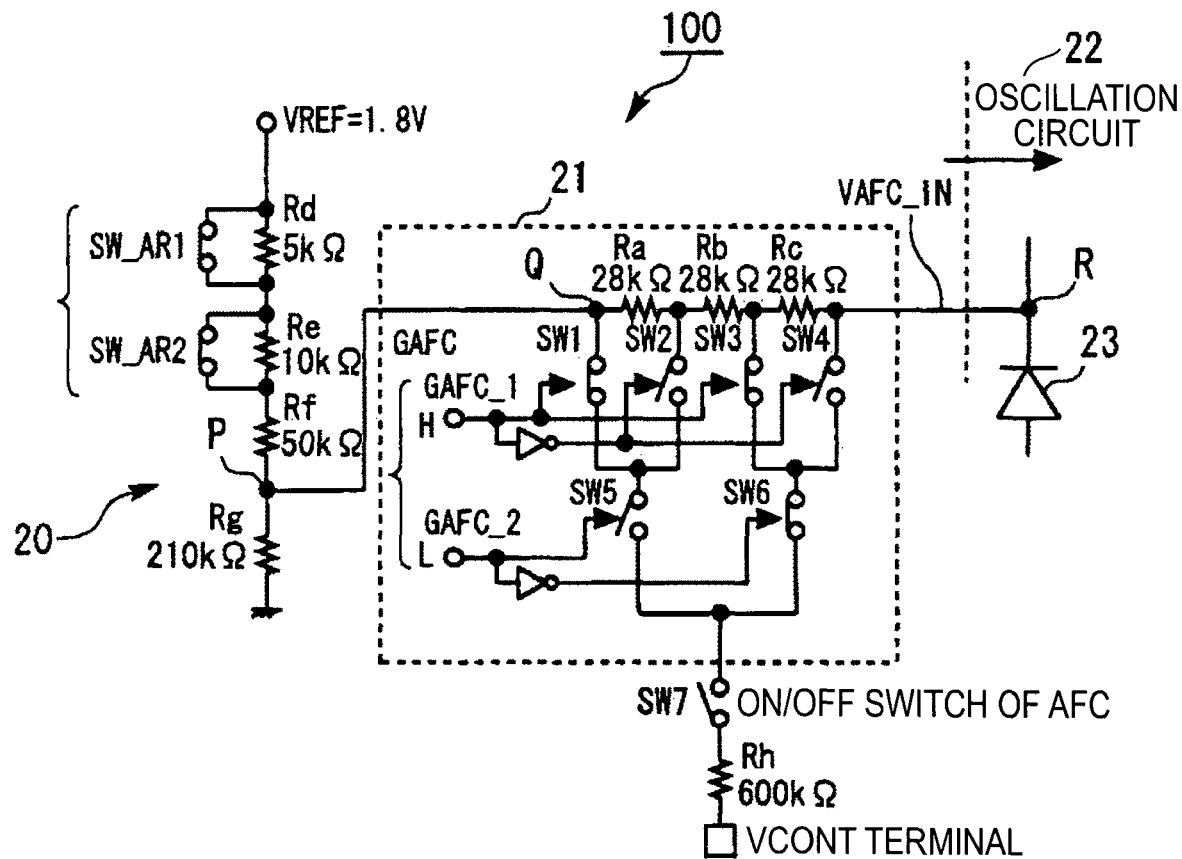
FIG. 5a is a circuit diagram showing an operation example (state 3) of a voltage control oscillator according to the first embodiment of the invention.
Figure 5B:
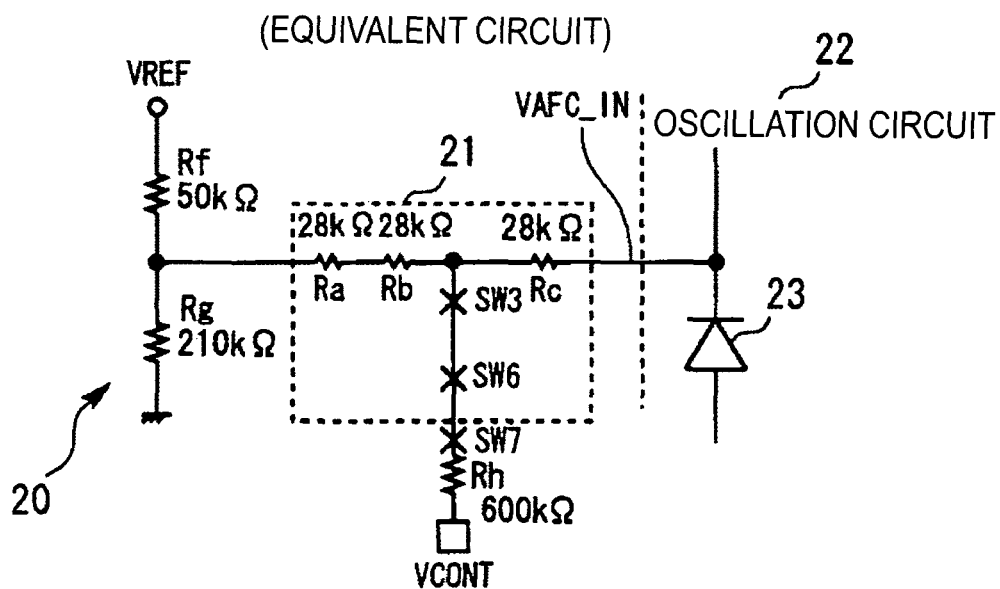
FIG. 5b is a diagram showing an equivalent circuit thereof.

FIG. 5a is a circuit diagram showing an operation example (state 3) of a voltage control oscillator according to the first embodiment of the invention, and FIG. 5b is a diagram showing an equivalent circuit thereof. Since this voltage control oscillator 100 has the same structure as that of FIG. 1, a description thereof is omitted.

FIG. 5b shows an equivalent circuit of the voltage control oscillator 100 in the state 3. Namely, both of the switches SW_AR1 and SW_AR2 of the reference bias voltage generating means 20 are "ON", so that VREF is divided by the resistances Rf and Rg to be VREFB, being supplied to the gain adjustment circuit 21. In the gain adjustment circuit 21, the SW3 and the SW6 are "ON". Therefore, if the SW7 is turned "ON", the VCONT terminal is coupled to the P through a route Rh-SW7-SW6-SW3-Rb-Ra. As a result, a composite voltage composed of a voltage on the connecting point and a voltage based on the VCONT applied through the resistance Rh, the SW7, the SW6, the SW3, the resistance Ra, and the resistance Rb is applied through the resistance Rc to the varactor 23 as VAFC_IN. That is, a potential of the VAFC_IN is a value of a composite voltage composed of a voltage obtained by dividing the VCONT by a voltage dividing circuit including the resistances Rg, Ra, Rb, and Rh, and a voltage obtained by dividing the VREF by a voltage dividing circuit including the resistances Rf and Rg. Therefore, the resistance Rc in the equivalent circuit of FIG. 5b does not contribute to a gain, but the resistances Ra and Rb contribute to the gain.

Figure 6A:
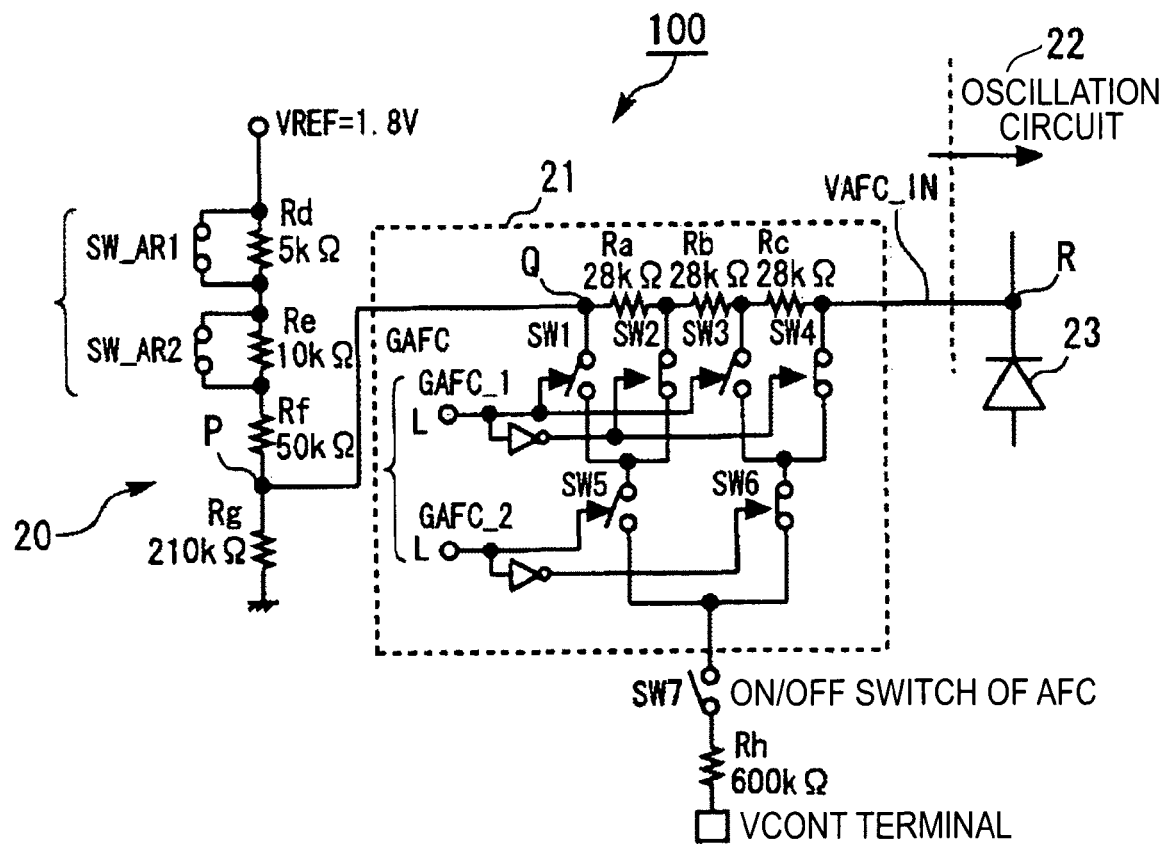
FIG. 6a is a circuit diagram showing an operation example (state 4) of a voltage control oscillator according to the first embodiment of the invention.
Figure 6B:
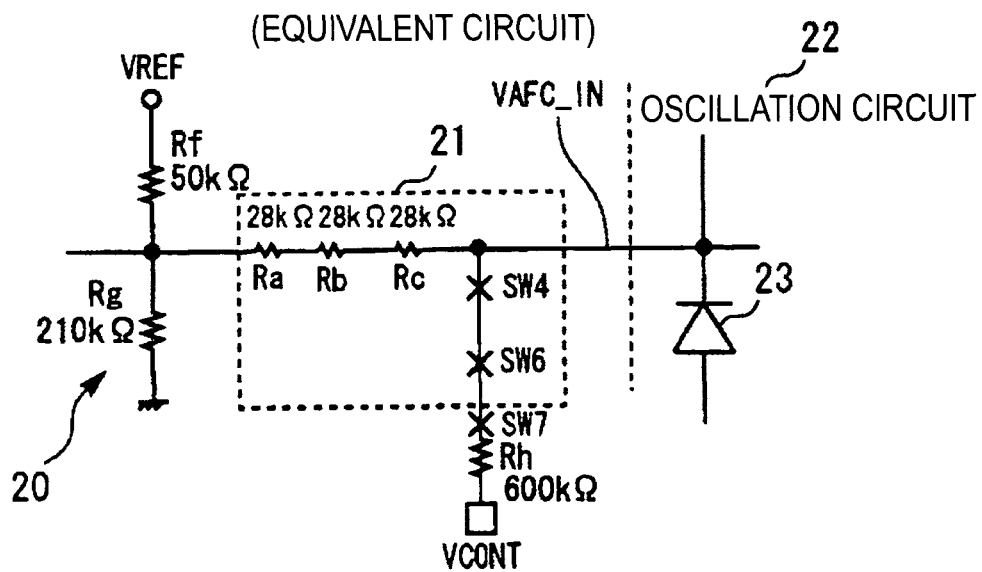
FIG. 6b is a diagram showing an equivalent circuit thereof.

FIG. 6a is a circuit diagram showing an operation example (state 4) of a voltage control oscillator according to the first embodiment of the invention, and FIG. 6b is a diagram showing an equivalent circuit thereof. Since this voltage control oscillator 100 has the same structure as that of FIG. 1, a description thereof is omitted.

FIG. 6b shows an equivalent circuit of the voltage control oscillator 100 in the state 4. Namely, both of the switches SW_AR1 and SW_AR2 of the reference bias voltage generating means 20 are "ON", so that VREF is divided by the resistances Rf and Rg to be VREFB, being supplied to the gain adjustment circuit 21. In the gain adjustment circuit 21, the SW4 and the SW6 are "ON". Therefore, if the SW7 is turned "ON", the VCONT terminal is coupled to the P through a route Rh-SW7-SW6-SW4-Rc-Rb-Ra. That is, a potential of the VAFC_IN is a value of a composite voltage composed of a voltage obtained by dividing the VCONT by a voltage dividing circuit including the resistances Rg, Ra, Rb, Rc, and Rh, and a voltage obtained by dividing the VREF by a voltage dividing circuit including the resistances Rf and Rg. As a result, a composite voltage composed of a voltage on the connecting point and a voltage based on the VCONT applied through the resistance Rh, the SW7, the SW6, the SW4, the resistance Ra, the resistance Rb, and the resistance Rc is applied to the varactor 23 as VAFC_IN. Therefore, the resistances Ra, Rb, and Rc in the equivalent circuit of FIG. 6b contribute to a gain.

Figure 7:
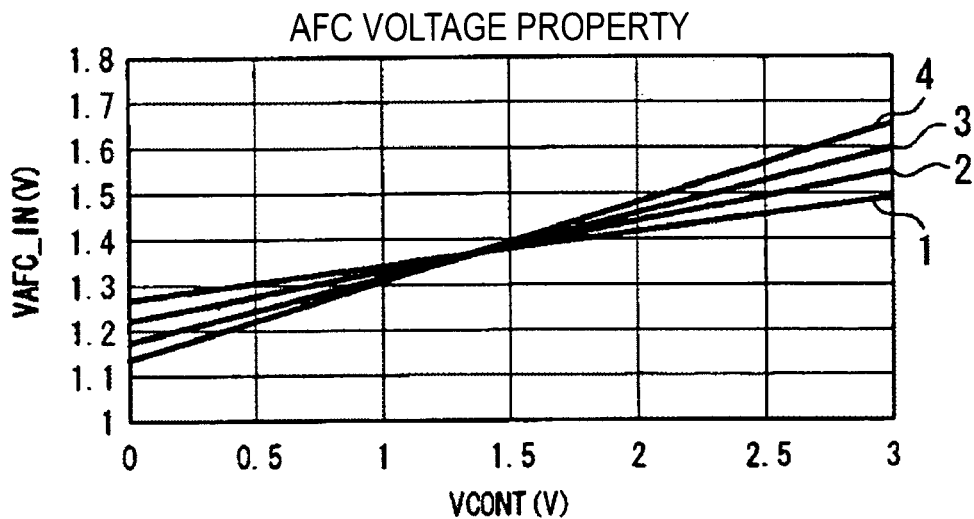
FIG. 7 is a graph showing an AFC voltage property when an operation example of the voltage control oscillator according to the first embodiment of the invention is changed from the state 1 to the state 4.

FIG. 7 is a graph showing an AFC voltage property when an operation example of the voltage control oscillator according to the first embodiment of the invention is changed from the state 1 to the state 4. A vertical axis shows VAFC_IN, and a horizontal axis shows VCONT. As is apparent from the graph, the gradient increases as the state changes from the state 1 to the state 4. This is because the value of the resistance Rc in FIG. 3 increases as the state changes from 1 to 4 and thus a gain voltage changes.

Figure 8:
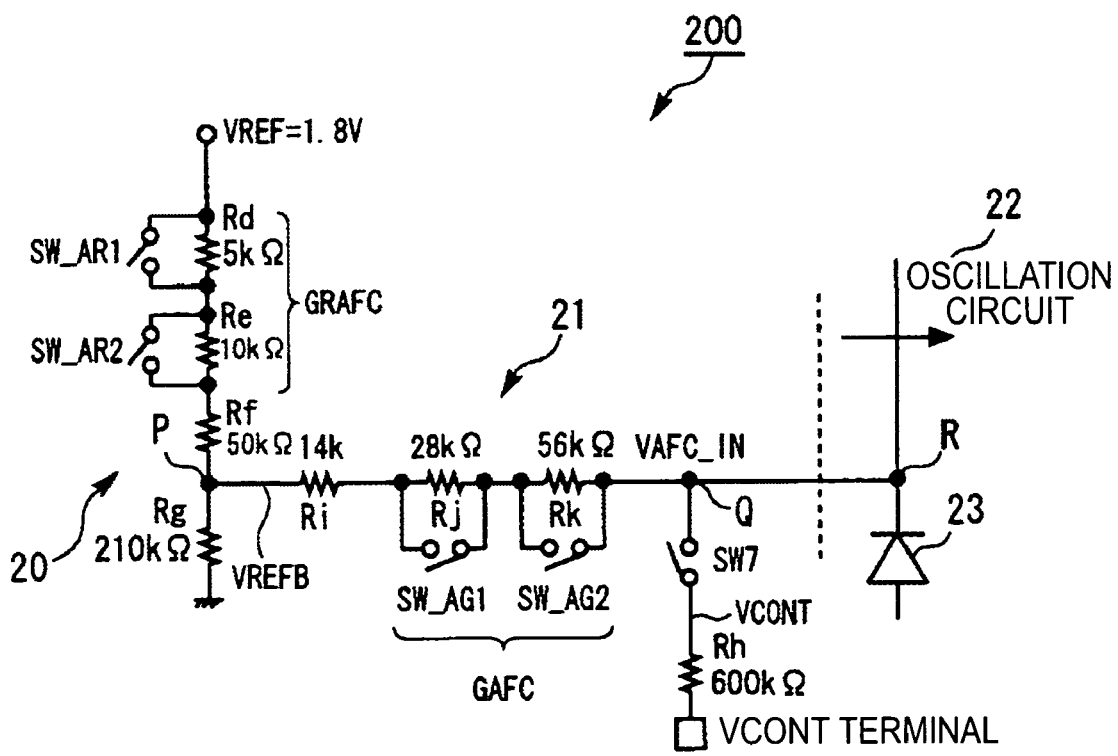
FIG. 8 is a circuit diagram showing a voltage control oscillator according to a second embodiment of the invention.

FIG. 8 is a circuit diagram showing a voltage control oscillator according to a second embodiment of the invention. Elements same as those in FIG. 1 are given the same reference numbers to be explained. This voltage control oscillator 200 includes: a reference bias voltage generating means 20 that generates a reference bias voltage (hereinafter, referred to as VREFB) by adjusting a reference voltage (hereinafter, referred to as VREF); a gain adjustment circuit 21 that adjusts a gain of a control voltage (hereinafter, referred to as VCONT); and an oscillation circuit 22. The reference bias voltage generating means 20 includes resistances Rd, Re, Rf, Rg connecting between the VREF and a ground in series; and switches SW_AR1, SW_AR2 respectively coupling to the resistance Rd and the resistance Re in parallel. The gain adjustment circuit 21 includes resistances Ri, Rj, Rk; and switches SW_AG1, SW_AG2. The oscillation circuit 22 includes a varactor 23 on the assumption of a Colpitts oscillation circuit. The VREFB is outputted from a connecting point P between the resistance Rf and the resistance Rg of the reference bias voltage generating means 20 to be supplied to the gain adjustment circuit 21. The VCONT is applied from the VCONT terminal through a resistance Rh and SW7 to a connecting point Q in the gain adjustment circuit 21. An output voltage (hereinafter, referred to as VAFC_IN) from the gain adjustment circuit 21 is applied to R of the varactor 23 in the oscillation circuit 22.

FIG. 9a is a graph showing a state of a bit of the SW_AG1 and the SW_AG2 (the SW_AR1 and the SW_AR2). Both of the SW_AG1 and the SW_AG2 (the SW_AR1 and the SW_AR2) are "0" in state 11. The SW_AG1 (the SW_µL) is "1" and the SW_AG2 (the SW_AR2) is "0" in state 12. The SW_AG1 (the SW_AR1) is "0" and the SW_AG2 (the SW_AR2) is "1" in state 13. Both of the SW_AG1 and the SW_AG2 (the SW_AR1 and the SW_AR2) are "1" in state 14. Here, "0" means switching OFF, and "1" means switching ON. Namely, in terms of GAFC, if the SW7 is turned "ON", the VCONT terminal is coupled to the P through a route Rh-SW7-Rf-Re-Rd in the state 11. As a result, a voltage on the connecting point is applied to the varactor 23 as VAFC_IN. In the state 12, if the SW7 is turned "ON", the VCONT terminal is coupled to the P through a route Rh-SW7-Rf-SW_AG1-Rd. As a result, a voltage on the connecting point is applied to the varactor 23 as VAFC_IN. In the state 13, if the SW7 is turned "ON", the VCONT terminal is coupled to the P through a route Rh-SW7-SW_AG2-Re-Rd. As a result, a voltage on the connecting point Q is applied to the varactor 23 as VAFC_IN. In the state 14, if the SW7 is turned "ON", the VCONT terminal is coupled to the P through a route Rh-SW7-SW_AG2-SW_AG1-Rd. As a result, a voltage on the connecting point Q is applied to the varactor 23 as VAFC_IN.

FIGS. 9b and 9c are graphs showing adjusting properties of GAFC and GRAGC in a case where an operation example of the voltage control oscillator according to the second embodiment of the invention is changed from the state 11 to the state 14. Vertical axes show VAFC_IN, and horizontal axes show VCONT. As is apparent from FIG. 9b, the gradient decreases as the state changes from 11 to 14. This is because the value of the resistance GAFC in FIG. 8 decreases as the state changes from 11 to 14 and thus a gain voltage changes. As is apparent from FIG. 9c, the gradient does not change if the state changes from 11 to 14, but a reference voltage decreases. This is because the value of the resistance GRAFC in FIG. 8 decreases as the state changes from 11 to 14 and thus a voltage dividing ratio changes.

Figure 10:
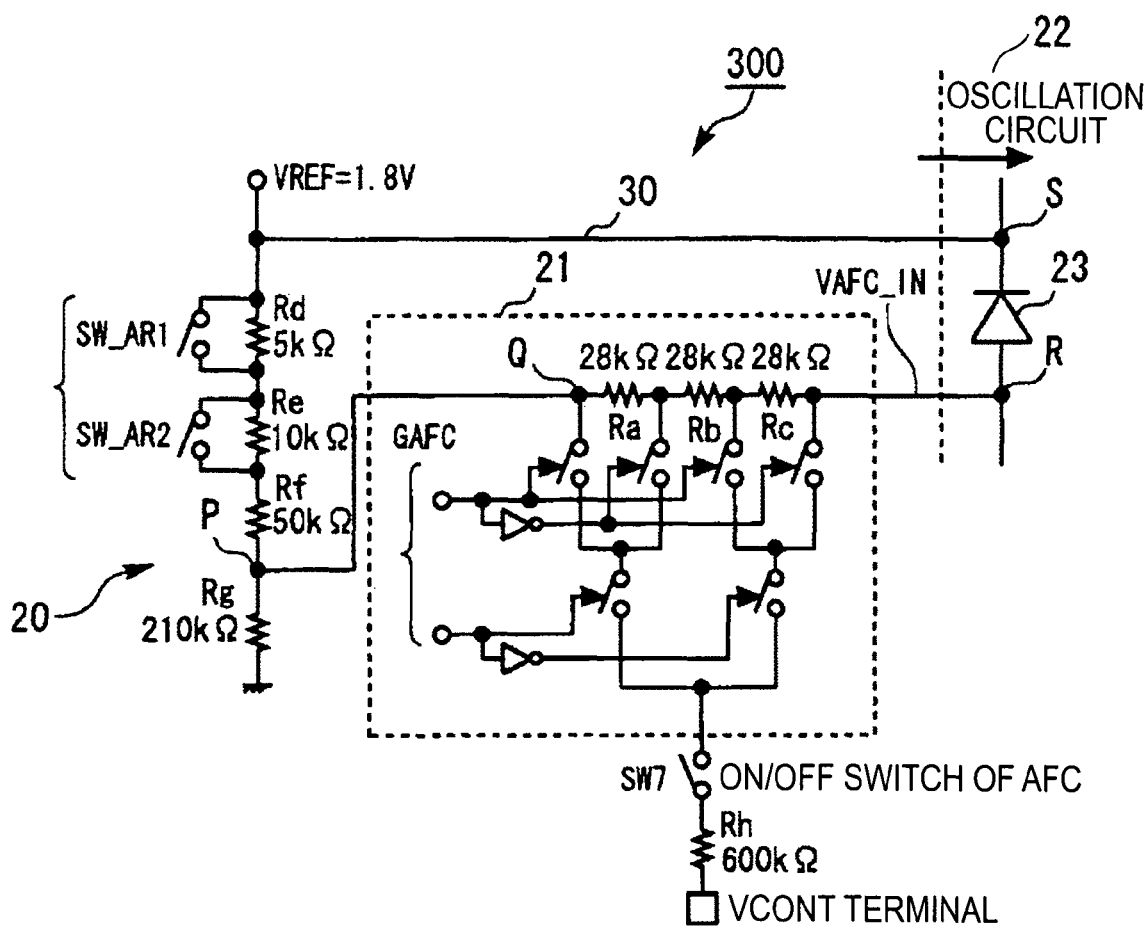
FIG. 10 is a circuit diagram showing a voltage control oscillator according to a third embodiment of the invention.
Figure 11:
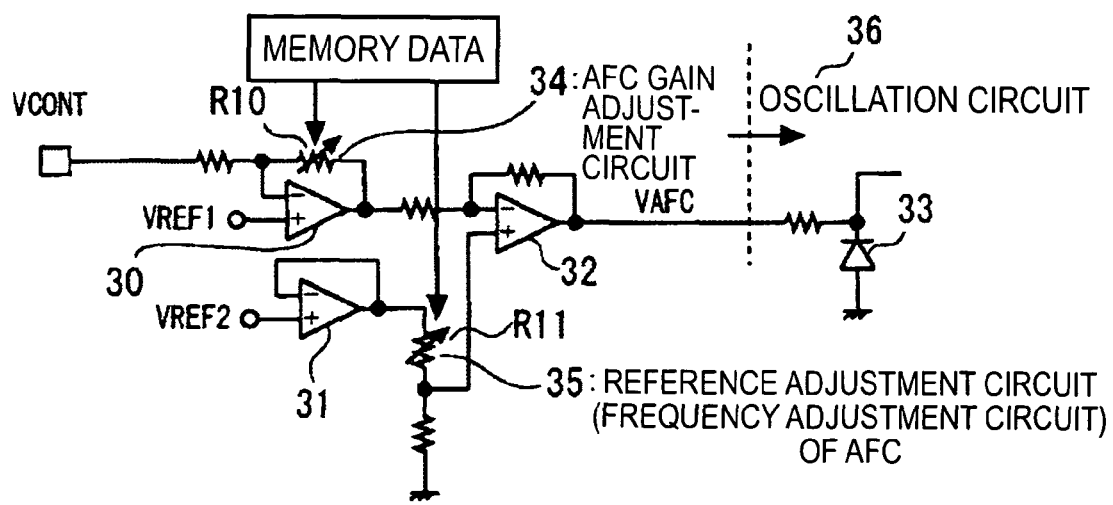
FIG. 11 is a diagram showing a circuit including an operational amplifier having related art AFC function.

FIG. 10 is a circuit diagram showing a voltage control oscillator according to a third embodiment of the invention. This voltage control oscillator 300 applies a reference voltage (VREF) from a circuit 30 to one terminal S of the varactor 23 of the oscillation circuit 22 and applies an AFC voltage (VAFC_IN) to the other terminal R of the varactor 23. Thus the reference voltage and the AFC voltage are applied to the terminals S and R of the varactor 23 of the oscillation circuit 22. Therefore, even if noises in phase are applied to the varactor 23, the noises are cancelled each other due to their same phase. Since this voltage control oscillator 300 has the same structure as that of FIG. 1, a description of an operation thereof is omitted.

According to the embodiments of the invention, the gain adjustment circuit 21 includes a plurality of resistances Ra, Rb, Rc and switching elements SW1 to SW6 coupling respective resistances. In the gain adjustment circuit 21, a voltage dividing circuit dividing by resistances is formed depending on the connecting fashion of the switching elements, requiring no capacitors. Thus an area of an IC chip can be reduced and the C/N can be improved due to the decrease of a noise.

In addition, the switching elements SW_AG1 and SW_AG2 are structured such that they are turned ON/OFF by hand, so that the C/N can be improved due to the decrease of a noise at a lower cost.

Further, the voltage dividing circuit couples a control voltage to the reference bias voltage generating means 20 directly or through at least one resistance based on a connecting state of the plurality of switching elements. The control voltage is supplied through serial resistance 600K coupled to an external control voltage terminal. Thus, the AFC voltage can be easily changed by changing the number of resistances of the voltage dividing circuit.

The reference bias voltage generating means 20 changes a voltage dividing ratio of the plurality of resistances provided between the reference voltage and the ground so as to change a reference bias voltage value. Thus the reference bias voltage can be easily changed with a simple structure.

Since the reference voltage is applied to the one terminal S of the varactor 23 and the AFC voltage is applied to the other terminal R of the varactor 23 of the oscillation circuit 22, noises in phase can be cancelled each other.

The invention claimed is:

1. A voltage controlled oscillator controlling an oscillation frequency based on a control voltage supplied from an external control voltage terminal, the voltage controlled oscillator comprising:

a reference bias voltage circuit generating a reference bias voltage by adjusting a reference voltage; and a gain adjustment circuit adjusting a gain of the control voltage, wherein the gain adjustment circuit includes (i) a plurality of resistances and (ii) a plurality of switching elements, wherein the gain adjustment circuit controls the plurality of switching elements and forms a voltage dividing circuit between the reference bias voltage and the external control voltage terminal to generate an automatic frequency control (AFC) voltage, wherein the reference bias voltage circuit includes (i) a plurality of serial resistances between the reference voltage and a ground and (ii) a switch coupled in parallel to at least one of the serial resistances, and wherein the reference bias voltage circuit controls the switch and changes a voltage dividing ratio of the serial resistances to set the reference bias voltage.

2. A voltage controlled oscillator controlling an oscillation frequency based on a control voltage supplied from an external control voltage terminal, the voltage controlled oscillator comprising:

a reference bias voltage circuit generating a reference bias voltage by adjusting a reference voltage; and a gain adjustment circuit adjusting a gain of the control voltage, wherein the gain adjustment circuit includes (i) a plurality of resistances and (ii) a plurality of switching elements, wherein the gain adjustment circuit controls the plurality of switching elements and forms a voltage dividing circuit between the reference bias voltage and the external control voltage terminal to generate an automatic frequency control (AFC) voltage, wherein the gain adjustment circuit further includes a driving circuit driving each of the plurality of switching elements, wherein the reference bias voltage generating circuit includes (i) a plurality of serial resistances between the reference voltage and a ground and (ii) a switch coupled in parallel to at least one of the serial resistances, and wherein the reference bias voltage circuit controls the switch and changes a voltage dividing ratio of the serial resistances to set the reference bias voltage.

3. A voltage controlled oscillator controlling an oscillation frequency based on a control voltage supplied from an external control voltage terminal, the voltage controlled oscillator comprising:

a reference bias voltage circuit generating a reference bias voltage by adjusting a reference voltage; and a gain adjustment circuit adjusting a gain of the control voltage, wherein the gain adjustment circuit includes (i) a plurality of resistances and (ii) a plurality of switching elements, wherein the gain adjustment circuit controls the plurality of switching elements and forms a voltage dividing circuit between the reference bias voltage and the external control voltage terminal to generate an automatic frequency control (AFC) voltage, wherein the control voltage is supplied through a serial resistance coupled to the external control voltage terminal, wherein the voltage dividing circuit couples the control voltage with the reference bias voltage circuit directly or through at least one of the resistances, based on a connecting state of the plurality of switching elements to change the AFC voltage, wherein the reference bias voltage circuit includes (i) a plurality of serial resistances between the reference voltage and a ground and (ii) a switch coupled to at least one of the serial resistances in parallel, and wherein the reference bias voltage circuit controls the switch and changes a voltage dividing ratio of the serial resistances to set the reference bias voltage.

\* \* \* \* \*